US010431451B2

(12) United States Patent
Agarwal et al.

(10) Patent No.: US 10,431,451 B2
(45) Date of Patent: Oct. 1, 2019

(54) METHODS AND APPARATUSES FOR INCREASING REACTOR PROCESSING BATCH SIZE

(71) Applicant: Lam Research Corporation, Fremont, CA (US)

(72) Inventors: Pulkit Agarwal, Beaverton, OR (US); Purushottam Kumar, Hillsboro, OR (US); Richard Phillips, Tualatin, OR (US); Adrien LaVoie, Newberg, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 35 days.

(21) Appl. No.: 15/799,679

(22) Filed: Oct. 31, 2017

(65) Prior Publication Data
US 2018/0374697 A1    Dec. 27, 2018

Related U.S. Application Data

(63) Continuation-in-part of application No. 14/466,925, filed on Aug. 22, 2014, now abandoned.

(51) Int. Cl.
| | |
|---|---|
| *H01L 21/31* | (2006.01) |
| *H01L 21/469* | (2006.01) |
| *H01L 21/02* | (2006.01) |
| *C23C 16/50* | (2006.01) |
| *C23C 16/458* | (2006.01) |
| *C23C 16/52* | (2006.01) |
| *H01J 37/32* | (2006.01) |
| *C23C 16/44* | (2006.01) |

(52) U.S. Cl.
CPC .... *H01L 21/02274* (2013.01); *C23C 16/4412* (2013.01); *C23C 16/458* (2013.01); *C23C 16/50* (2013.01); *C23C 16/52* (2013.01); *H01J 37/32449* (2013.01); *H01J 37/32862* (2013.01); *H01J 37/32183* (2013.01); *H01J 2237/3321* (2013.01); *H01L 21/02164* (2013.01)

(58) Field of Classification Search
CPC ......... H01L 21/02274; H01L 21/02164; C23C 16/4412; C23C 16/458; C23C 16/50; C23C 16/52; H01J 37/32449; H01J 37/32862; H01J 37/32183; H01J 2237/3321

USPC ........................................................ 438/778
See application file for complete search history.

(56) References Cited

U.S. PATENT DOCUMENTS

| | | | |
|---|---|---|---|
| 8,524,612 B2 | 9/2013 | Li et al. | |
| 9,828,672 B2 | 11/2017 | Varadarajan et al. | |
| 2010/0062614 A1* | 3/2010 | Ma | C23C 16/34 438/785 |
| 2012/0040536 A1* | 2/2012 | Furuta | C23C 16/345 438/791 |
| 2015/0287740 A1* | 10/2015 | Bedell | H01L 29/7848 257/351 |
| 2015/0340225 A1 | 11/2015 | Kim et al. | |
| 2016/0056032 A1* | 2/2016 | Baldasseroni | H01L 21/0228 438/778 |
| 2017/0029947 A1 | 2/2017 | Kawahara et al. | |
| 2017/0029948 A1 | 2/2017 | Jongbloed et al. | |
| 2017/0133202 A1* | 5/2017 | Berry, III | H01J 37/3222 |
| 2017/0207069 A1* | 7/2017 | Bhatia | B08B 5/00 |

OTHER PUBLICATIONS

International Search Report and Written Opinion of the International Searching Authority, dated Feb. 22, 2019, for International Patent Application No. PCT/US2018/058164.

* cited by examiner

*Primary Examiner* — Calvin Y Choi
(74) *Attorney, Agent, or Firm* — Weaver Austin Villeneuve & Sampson LLP

(57) ABSTRACT

Certain embodiments herein relate to methods of increasing a reaction chamber batch size. A portion of a batch of wafers is processed within the chamber. The processing results in at least some off-target deposition of material on interior surfaces of the reaction chamber. A mid-batch chamber processing is conducted to stabilize the off-target deposition materials accumulated on the chamber interior surfaces. Another portion of the batch of wafers is processed within the chamber. In various embodiments, processing of the chamber (e.g., mid-batch) and subsequent portion of the batch of wafers is repeated until processing of all wafers is complete. Batch size refers to the number of wafers that may be processed in the reaction chamber between chamber clean cycles. Chamber interior surfaces are seasoned prior to batch processing. Seasoning of the chamber interior surfaces involves applying a coating of the same material that may be used for deposition on the wafers during processing of the same.

20 Claims, 9 Drawing Sheets

| | Parameters | Process | UCT | Mid-batch -1/2 |
|---|---|---|---|---|
| Flow (sccm) | Precursor flow | 500-3,000 sccm | 500-3,000 sccm | 500-3,000 sccm |
| | Carrier flow | 1,000 - 15,000 Ar | 1,000 - 15,000 Ar | 1,000 - 15,000 Ar |
| | Oxidizer flow | 1,000 - 20,000 N2O/O2 | 1,000 - 20,000 N2O/O2 | 1,000 - 20,000 N2O/O2 |
| | Purge flow | N2 5,000 - 50,000 | N2 5,000 - 50,000 | N2 5,000 - 50,000 |
| | Pressure | 1-10T | 1-10T | 1-10T |
| | 2nd purge | N2/O2 5,000 - 50,000 | N2/O2 5,000 - 50,000 | N2/O2 5,000 - 50,000 |
| Step timings (s) | Dose time | 0.01 - 1s | 0.01 - 1s | 0.01 - 1s |
| | PDP time | 0.01 - 1s | 0.01 - 1s | 0.01 - 1s |
| | RF time | 0.1 - 20s | 0.1 - 20s | 0.1 - 20s |
| | RF purge time | 0.01 - 1s | 0.01 - 1s | 0.01 - 1s |
| Temp | Ampoule temp | 30-70°C | 30-70°C | 30-70°C |
| | Gas line temp | 30-70°C | 30-70°C | 30-70°C |
| | Ped Temp | 25C - 400°C | 25C - 400°C | 25C - 400°C |
| | Chamber temp | 25C - 100°C | 25C - 100°C | 25C - 100°C |
| | Top plate temp | 25C - 100°C | 25C - 100°C | 25C - 100°C |
| Power | SHD power | 500W - 7kW | 500W - 7kW | 3kW - 10kW |
| | Ped Power | 500W - 7kW | 500W - 7kW | 500W - 7kW |
| | Frequency | 200kHz or 13.56 MHz or 27MHz | 200kHz or 13.56 MHz or 27MHz | 200kHz - 13.56 KHz (preferably low frequency) |
| | Tuning mode | Frequency | Frequency | Frequency |
| Post Treatment | Post treatment | None | None | Can be combined with treatment |
| | Power | | | 500W - 7kW |
| | Gas | | | H2 or He or Ar or N2 or O2 or combination of these |
| | Frequency | | | 200kHz or 13.56 MHz or 27MHz |
| | Time | | | 0.1s - 600s |

Fig. 5A

| | Parameters | Mid-batch -3 | Mid-batch -4 | Comment |
|---|---|---|---|---|
| Flow (sccm) | Precursor flow | NA | 500-3,000 sccm | |
| | Carrier flow | NA | 1,000 - 15,000 Ar | |
| | Oxidizer flow | NA | 1,000 - 20,000 N2O/O2 | |
| | Purge flow | N2 5,000 - 50,000 | N2 5,000 - 50,000 | |
| | Pressure | 1-10T | 1-10T | |
| | 2nd purge | No flow to diffuse plasma to SHD | N2/O2 5,000 - 50,000 | |
| Step timings (s) | Dose time | NA | 0.01 - 1s | |
| | PDP time | 0.01 - 1s | 0.01 - 1s | |
| | RF time | 0.1 - 600s | 0.1 - 20s | |
| | RF purge time | 0.01 - 60s | 0.01 - 1s | |
| Temp | Ampoule temp | 30-70C | 30-70C | |
| | Gas line temp | 30-70C | 30-70C | |
| | Ped Temp | 25C - 400°C | 25C - 400°C | |
| | Chamber temp | 25C - 100°C | 25C - 100°C | |
| | Top plate temp | 25C - 100°C | 25C - 100°C | |
| Power | SHD power | 500W - 7kW | 500W - 7kW (Chamber will be grounded) | Either SHD power or ped |
| | Ped Power | 500W - 7kW | 500W - 7kW (Chamber will be grounded) | Either SHD power or ped |
| | Frequency | 200kHz or 13.56 MHz or 27MHz | 200kHz or 13.56 MHz or 27MHz | |
| | Tuning mode | Frequency | Frequency | |
| Post Treatment | Post treatment | Yes (based on above parameters) - No Dep | Can be combined with treatment | |
| | Power | 500W - 7kW | 500W - 7kW | |
| | Gas | H2 or He or Ar or N2 or O2 or combination of these | H2 or He or Ar or N2 or O2 or combination of these | |
| | Frequency | 200kHz or 13.56 MHz or 27MHz | 200kHz or 13.56 MHz or 27MHz | |
| | Time | 0.1s - 600s | 0.1s - 600s | |

Fig. 5B

|  | Remote Clean Recipe |
|---|---|
| HP Clean | HP Clean |
| Power | Remote source |
| Pressure | 1-5T |
| He |  |
| O2 |  |
| Ar | 1,000-5,000 sccm |
| N2 |  |
| NF3 | 1,000-10,000 sccm |
| Pedestal temp | 25°C - 400°C |
| LP Clean | LP Clean |
| Power | Remote source |
| Pressure | 0.01- 5T |
| He |  |
| O2 |  |
| Ar | 1,000-20,000 sccm |
| N2 |  |
| NF3 | 500-10,000 sccm |
| Pedestal temp | 25°C - 400°C |

Fig. 6

METHODS AND APPARATUSES FOR INCREASING REACTOR PROCESSING BATCH SIZE

CROSS-REFERENCE TO RELATED APPLICATION

This application is a continuation-in-part of U.S. application Ser. No. 14/466,925, titled "METHODS AND APPARATUSES FOR STABLE DEPOSITION RATE CONTROL IN LOW TEMPERATURE ALD SYSTEMS BY SHOWERHEAD ACTIVE HEATING AND/OR PEDESTAL COOLING," filed Aug. 22, 2014.

BACKGROUND

Semiconductor processing typically takes place in specialized processing apparatus where attaining optimized and efficient throughput is often desirable. Such apparatus may include a reaction chamber that houses a batch of wafers during processing. The reaction chamber also may include various pieces of hardware (e.g., a substrate support piece, showerhead, etc.) used in semiconductor fabrication. In some cases, the reaction chamber may be treated, or seasoned, before it is used for processing substrates. The reaction chamber treatment may take a number of different forms, and may be performed for a variety of reasons. Further, in some cases, the total number of wafers able to be processed by the reaction chamber between clean cycles may be limited due to the accumulation of off-target film deposited on various internal components of the reaction chamber, requiring that the processing be stopped and the chamber shut down for cleaning.

SUMMARY

Certain embodiments herein relate to a method of increasing a reaction chamber batch size, the method involving: (a) processing a portion of a batch of wafers within the reaction chamber, wherein the processing results in at least some off-target deposition of material on interior surfaces of the reaction chamber; (b) conducting a mid-batch reaction chamber processing to stabilize the off-target deposition materials accumulated on interior surfaces of the reaction chamber; and (c) processing another portion of the batch of wafers within the reaction chamber.

The methods may further involve repeating (b)-(c) until the processing of the batch of wafers is complete.

In some embodiments, the reaction chamber batch size is the number of wafers that can be processed in the reaction chamber between reaction chamber clean cycles.

The methods may further involve seasoning the interior surfaces of the reaction chamber prior to batch processing therein.

In some embodiments, the seasoning the interior surfaces of the reaction chamber involves applying a coating of the same material that is used for deposition on the batch of wafers during (a) or (c).

In some embodiments, (a) or (c) may involve depositing a material on a wafer of the batch of wafers.

In some embodiments, the seasoning comprises applying a coating to interior surfaces of the reaction chamber by atomic layer deposition (ALD) while no wafers are present in the reaction chamber.

The methods may further involve cleaning the reaction chamber interior surfaces following completion of (c).

The methods may further involve (d) cleaning the reaction chamber interior surfaces after processing of the batch of wafers is complete.

In some embodiments, (b) is conducted at specified intervals of a total batch accumulation limit of the batch of wafers. Further, the specified intervals may be determined empirically. Moreover, the specified intervals may occur prior to a detrimental level of material accumulation on the chamber interior surfaces that results in flaking of the materials and production of wafer defects and/or particles.

In some embodiments, the total batch accumulation limit is the thickness of accumulated material on interior surfaces of the reaction chamber beyond which processing is compromised such that cleaning of the reaction chamber is required prior to further processing.

In some embodiments, (b) involves depositing a film that binds to the materials accumulated on the interior surfaces of the reaction chamber. Further, compressibility of the deposited film may be enhanced by adjusting any one or more selected from a group consisting of: radio frequency (RF) power levels, reaction chamber pressure, or RF processing time.

In some embodiments, wherein (b) involves exposing the materials accumulated on the interior surfaces of the reaction chamber to a plasma after the materials accumulate to a specified thickness. Further, the plasma exposure may be conducted at a pressure within a range of 2 Torr to 10 Torr to facilitate plasma diffusion into film deposited on the interior surfaces of the reaction chamber. Moreover, the plasma may be ignited on a faceplate of a showerhead within the reaction chamber. Still further, the plasma may be derived from any one selected from a group consisting of: hydrogen, helium, argon, or nitrogen-containing sources. Even further, the exposure to the plasma may deposit a film of approximately 200 Å on the materials accumulated on the interior surfaces of the reaction chamber. Also, a purge may be deactivated to permit the plasma to dissipate uniformly throughout the reaction chamber. In some embodiments, the plasma has a frequency of 400 kHz.

In some embodiments, the deposited film stabilizes the materials on the interior surfaces of the reaction chamber. Further, exposure to the plasma may densify the deposited film to stabilize the materials on the interior surfaces of the reaction chamber. Moreover, compressibility of the film may be increased by a method selected from a group consisting of: applying a radio frequency (RF) power in a range of 2 kw-7 kw, applying a high pressure in a range of 2 torr-10 torr, or using a RF plasma time of 0.2 s-10 s.

The methods may further involve (d) grounding the reaction chamber. Further, the grounded reaction chamber may facilitate plasma diffusion to the exterior of the reaction chamber. In some embodiments, a showerhead that may be configured to deliver a deposition gas to the batch of wafers is powered. Also, in some embodiments, a pedestal configured to support the batch of wafers is powered. Further, the plasma used to conduct (d) may be supplied by a remote plasma clean unit. The remote plasma clean unit may be on-board with the reaction chamber.

Another aspect involves a plasma processing apparatus for processing a substrate. The apparatus may further include a reaction chamber comprising: interior chamber surfaces, a substrate support for supporting a substrate within the reaction chamber, and an exhaust port for removing material from the reaction chamber; a remote plasma chamber comprising: a plasma generator for generating plasma within the remote plasma chamber, an inlet for delivering gas to the remote plasma chamber, an outlet for providing plasma generated in the remote plasma chamber to the reaction chamber; and a controller configured to execute instructions for: processing a portion of a batch of wafers within the reaction chamber; conducting a mid-batch reaction chamber processing to stabilize materials accumulated on interior surfaces of the reaction chamber as a result of the batch processing; and processing another portion of the batch of wafers within the chamber.

In some embodiments, the plasma processing apparatus is remote from the reaction chamber.

In some embodiments, the controller is further configured to execute instructions for: cleaning the interior surfaces of the reaction chamber following completion of (c).

These and other aspects are described further below with reference to the drawings.

BRIEF DESCRIPTION OF THE DRAWINGS

FIGS. 5A-5B are exemplary tables presenting sample operational conditions for a method in accordance with disclosed embodiments.

FIG. 6 is an exemplary table presenting sample operational conditions for a method in accordance with disclosed embodiments.

DETAILED DESCRIPTION

Figure 1:
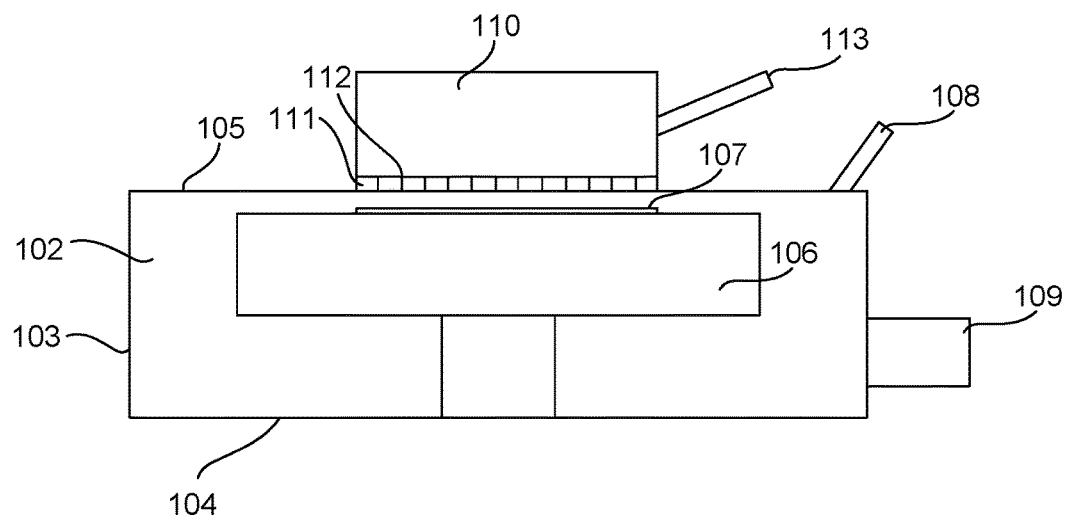
FIG. 1 illustrates a simplified view of a reaction chamber for processing a substrate using plasma delivered from a remote source.

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

In this application, the terms "wafer" and "substrate" are used interchangeably. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates, and can be scaled as appropriate for substrates or chambers of other sizes. The chambers described herein may be used to process work pieces that may be of various shapes, sizes, and materials. In addition to semiconductor wafers, other work pieces that may be processed in chambers prepared according to certain embodiments include various articles such as printed circuit boards, magnetic recording media, magnetic recording sensors, mirrors, optical elements, micro-mechanical devices and the like.

Introduction

Attaining efficient reaction chamber productivity is desirable in semiconductor fabrication. Batches of wafers are traditionally supplied to a reaction chamber for processing, e.g., deposition, on the wafer(s) therein. However, inadvertent off-target deposition of materials onto various interior chamber surfaces, e.g., sidewalls of the reaction chamber, may contribute to the eventual particle generation, for example by flaking of such materials onto wafers being processed in the chamber. Such flaking of off-target materials is undesirable as it may contaminate wafers being processed, thereby degrading the overall quality of the processed batch of wafers.

Traditionally, conducting a complete clean of the reaction chamber interior was required upon reaching a reaction chamber batch size, the maximum number of wafers able to be processed in a reaction chamber prior to substantial likelihood of contamination of a wafer being processed by particle generation from accumulated off-target deposition in the chamber. Conducting such a clean requires the reaction chamber to be vacated of contents held therein for processing, thus potentially reducing throughput and preventing the processing of a larger batch of wafers within a specified time.

Increasing the reaction chamber batch size will increase productivity (or throughput) by allowing additional wafers to be processed within the reaction chamber between required clean cycles. Such an increase may be accomplished by one or more of the methods disclosed herein, namely application of Batch Increase Accumulation Sequence (BIAS) related processes, which describe processes by which normal wafer processing is briefly interrupted with an intermediate, or mid-batch, chamber processing to stabilize off-target materials deposited on interior reaction chamber components (e.g., chamber interior sidewalls) to prevent such materials from flaking or otherwise generating particles and contaminating wafers being processed.

Flaking, as used herein and elsewhere throughout the present disclosure, may refer to a form of particle generation by partial or total disintegration of off-target deposited materials on interior surfaces of the reaction chamber onto the batch of wafers being processed therein. Flaking is an undesirable situation and may compromise the quality of the processed batch by introducing defects and/or other particles to the wafer. In addition to flaking, "peeling" may be observed. Peeling describes a specific type of flaking where a top exposed surface of off-target deposit material uniformly disengages from the interior wall from which it was attached to fall upon the a wafer during processing.

Reaction Chamber

FIG. 1 presents a simplified exemplary view of a reaction or processing chamber in connection with which processes and apparatus in accordance with the present disclosure may be implemented. A processing chamber 102 includes chamber walls 103, chamber floor 104, and chamber ceiling 105. Positioned within the processing chamber 102 is a substrate support 106, on which substrate 107 sits. The processing chamber 102 also includes an inlet 108 and an exhaust outlet 109. In some embodiments, a remote plasma source 110 is provided above the processing chamber 102. The remote plasma source 110 includes a plasma generator (not shown) for generating a plasma within the remote plasma source. The plasma generator includes hardware (e.g., coils, electrodes, etc.) for producing a plasma, which may be an inductively coupled plasma (ICP), a capacitively coupled plasma (CCP), or a microwave generated plasma, etc. The remote plasma source 110 is separated from the processing chamber 102 by a showerhead 111 having a plurality of showerhead holes 112. The remote plasma source 110 has an inlet 113 for providing gas used to generate the remote plasma.

Under typical circumstances, a collection of wafers, e.g. one, two to four wafers, are sequentially processed, e.g., a deposition is performed on the wafers, within the processing chamber 102. For example, four wafers enter into processing chamber 102, are processed and are then removed. Next, four additional unprocessed wafers may be delivered into the processing chamber 102 for processing. Such a delivery of collections of wafers until a total target quantity or "batch" between required chamber clean cycles is reached may be referred to as "batch processing." Wafers are sequentially processed, at one or more stations (e.g., 1, 2 or 4 stations) until a reaction chamber batch size (e.g., limit) is reached. Application of BIAS expands the reaction chamber batch size by intermediate processing of off-target deposited materials to prevent such materials from disrupting subsequent wafer processing. Thus, with the application of BIAS, a significant number of wafers may be processed prior to temporarily interrupting wafer processing to treat or to clean interior surfaces of the reaction chamber of residue accumulating from off-target deposition thereon.

Figure 2:
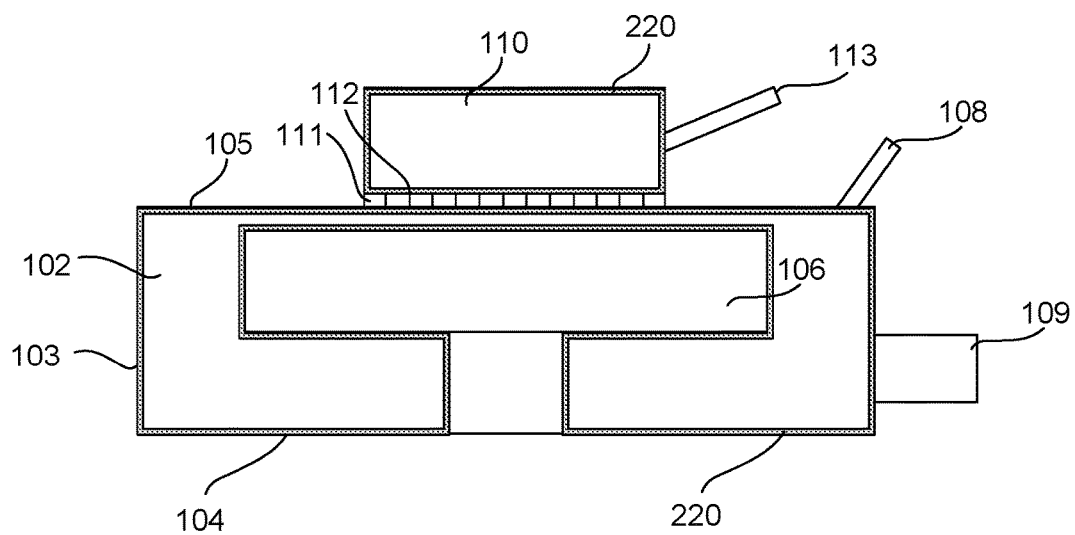
FIG. 2 shows the reaction chamber of FIG. 1 with a coating covering interior surfaces of the chamber.

FIG. 2 illustrates the apparatus shown in FIG. 1 after its interior component surfaces have been coated, e.g., "seasoned" by applying an undercoat (UCT) such as a coating 220, as further described below. Generally, "seasoning" refers to the process of preparing interior surfaces of a reaction chamber for the processing of wafers therein. In some embodiments, seasoning may involve the application of a coating or UCT of silicon oxide ($SiO_2$) to the interior surfaces. In other embodiments, silicon oxides ($SiO_X$), nitrides, tungsten, or other suitable materials, such as dielectric materials, may be used in seasoning depending on what is to be deposited within the reaction chamber.

The depicted coating 220 can also represent the accumulation of off-target deposition of materials during processing of wafers in the reaction chamber. The term "accumulation," as used herein and elsewhere in the present disclosure, generally describes the build-up of off-target deposited materials on the interior surfaces of the reaction chamber. Likewise, the term "normal accumulation" describes the traditional process of accumulation during processing of a batch of wafers within the reaction chamber, which is cleaned upon reaching a maximum reaction chamber batch size. The substrate 107, e.g., a wafer, is not shown in this figure, and the coating 220 is exaggerated in thickness for the purpose of illustration. Further, the coating 220 may be present in areas not visible in FIG. 2, such as on interior surfaces of the showerhead holes 112. In some embodiments, the low recombination material coating 220 covers only surfaces that are on the inside of the processing chamber 102.

Processing of substrate 107, e.g., a semiconductor wafer, may involve deposition thereon by a variety of processes, such as Atomic Layer Deposition (ALD). During wafer processing, specified quantities of wafers, e.g. one, two or four wafers, may be processed within the processing chamber 102 then later cycled out to allow for the entrance of new unprocessed wafers. After a certain amount of time spent processing quantities of wafers, material intended for deposition on the wafers may begin to accumulate on unintended locations, such as on the chamber walls 103. Eventually, such off-target deposited materials may begin to generate particles, e.g., flake and fall, or otherwise move, from the chamber walls 103 onto the substrate 107 to contaminate wafer processing.

Thus, the implementation of processes described further in FIGS. 4 and 5A-5B may secure or stabilize such off-target deposition materials on the chamber walls. Such a stabilization of off-target deposition materials may permit for additional ongoing processing of substrates 107 until an eventual clean cycle of the chamber walls 103 must be conducted to extract and dispose of the off-target deposition materials. Generally, a clean cycle refers to the removal of unwanted off-target deposition materials from various internal reactor components, such as sidewalls. The reaction chamber is typically cleaned to allow for processing of wafers within the reaction chamber to resume. A chamber clean may be wet, with liquid phase chemistry, or a dry, e.g., with a plasma. Also, a chamber clean may be conducted by providing a plasma to the reaction chamber, often referred to as a "plasma clean," for the cleaning of off-target deposited materials on interior surfaces of the reaction chamber. The plasma clean may be conducted using an in situ or remote plasma.

Figure 3:
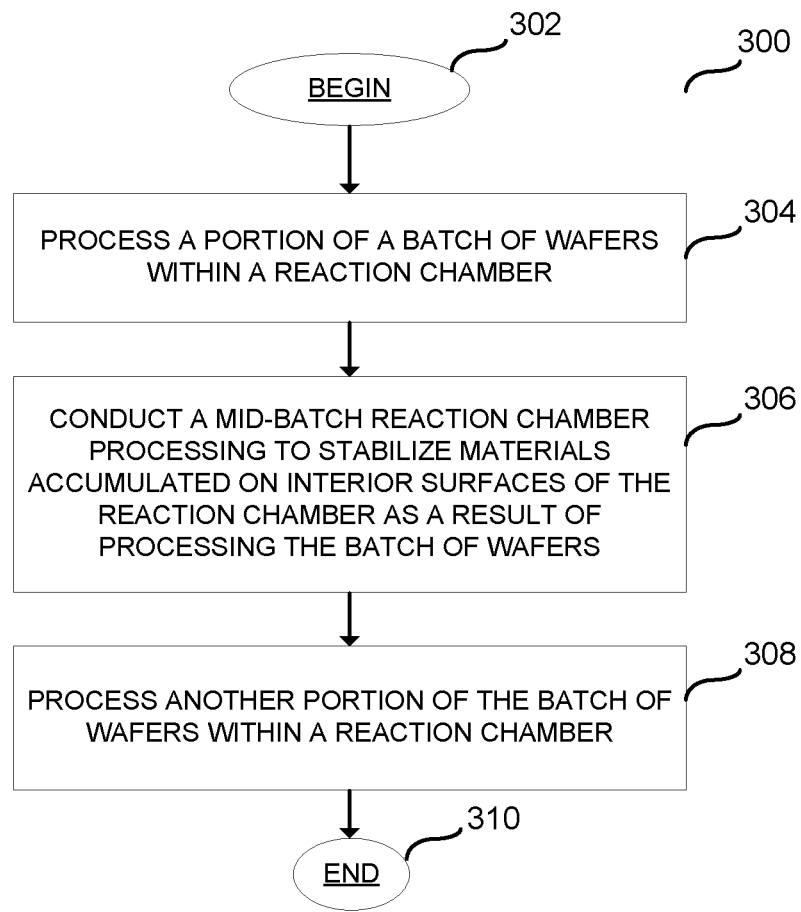
FIG. 3 is a process flow diagram depicting operations for a method in accordance with disclosed embodiments.

FIG. 3 shows an exemplary process flow 300 for addressing issues raised by off-target deposition on interior surfaces of a reaction chamber during batch processing of wafers. Process 300 begins at operation 302, which involves providing one or more wafers to a reaction chamber, such as the process chamber, such as is illustrated in FIG. 1.

In some embodiments, multiple wafers may be entered into the reaction chamber for multi-station sequential processing and later removed from the reaction chamber upon completion of processing. In other embodiments, the chamber may be configured for processing one wafer at a time. Such processing of multiple wafers may be collectively referred to as "batch processing," wherein a "batch" of wafers refers to the total number of wafers that can be processed in the reaction chamber between reaction chamber clean cycles, before the reactor needs to be shut down for full cleaning in order to continue processing wafers without risk of process drift and/or wafer contamination from particle generation such as flaking of accumulated off-target material deposition on internal reactor components, particularly sidewalls, due to processing of the wafers within the reaction chamber. Generally, a clean cycle involves a complete deactivation of the reaction chamber to accommodate a full cleaning prior to continuing processing of wafers without risk of contamination from particle generation, for example, flaking of accumulated off-target material deposited on internal reactor components, particularly sidewalls, due to prior processing of wafers within the reaction chamber.

Under typical batch processing procedures, desired process throughput may be limited due to the ongoing accumulation of off-target materials on interior surfaces of the reaction chamber during processing of the batch of wafers. Operation 306, conducted after initial processing of a portion of the batch of wafers, addresses off-target deposition by conducting a mid-batch reaction chamber processing to stabilize off-target materials deposited on, for example, sidewalls of the reaction chamber. Any wafers within the reaction chamber may be removed from the reaction chamber prior to initiation of the mid-batch processing at operation 306 to avoid unwanted contamination from the mid-batch processing. In some embodiments, the mid-batch processing may involve one or more distinct process variants, further described in FIGS. 4A-4B. After completion of the mid-batch processing of the reaction chamber at operation 306, another portion of the batch of wafers may be processed within the reaction chamber at operation 308 prior to ending process 300 at operation 310.

Accordingly, implementation of the mid-batch reaction chamber processing at operation 306 may increase the total number of wafers able to be processed within the reaction chamber between required clean cycles, thus effectively increasing the batch size of the wafers to be processed. Thus, process 300 including operation 306, also referred to as a Batch Increase Accumulation Sequence (BIAS), is desirable to increase total operational throughput of wafers processed in a given reaction chamber by extending the usability, or lifespan, of the reaction chamber between required clean cycles, e.g., where accumulated off-target deposition materials are removed from adhering to sidewalls of the reaction chamber.

Figure 4A:
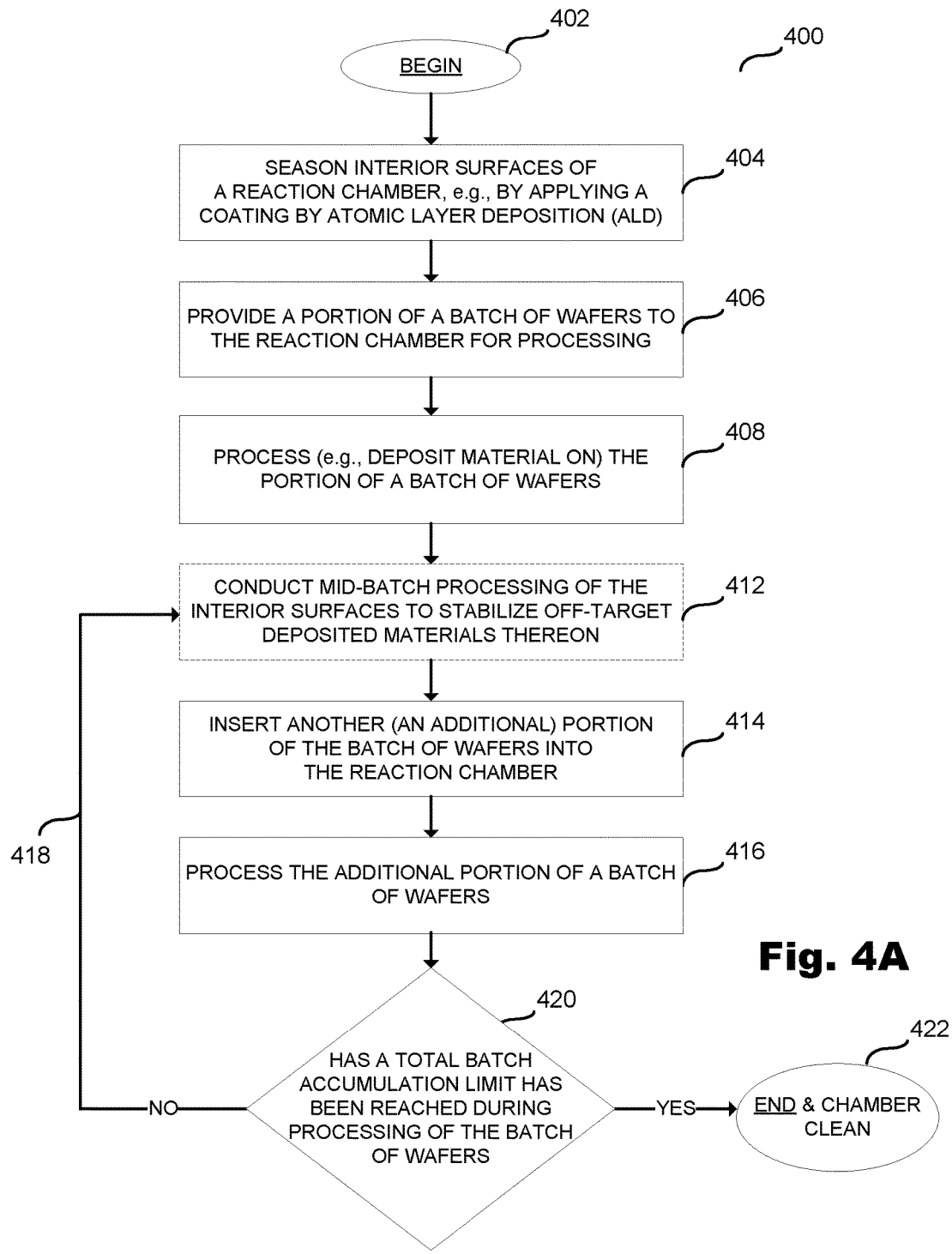
FIGS. 4A-4B are process flow diagrams depicting operations for a method in accordance with disclosed embodiments.
Figure 4B:
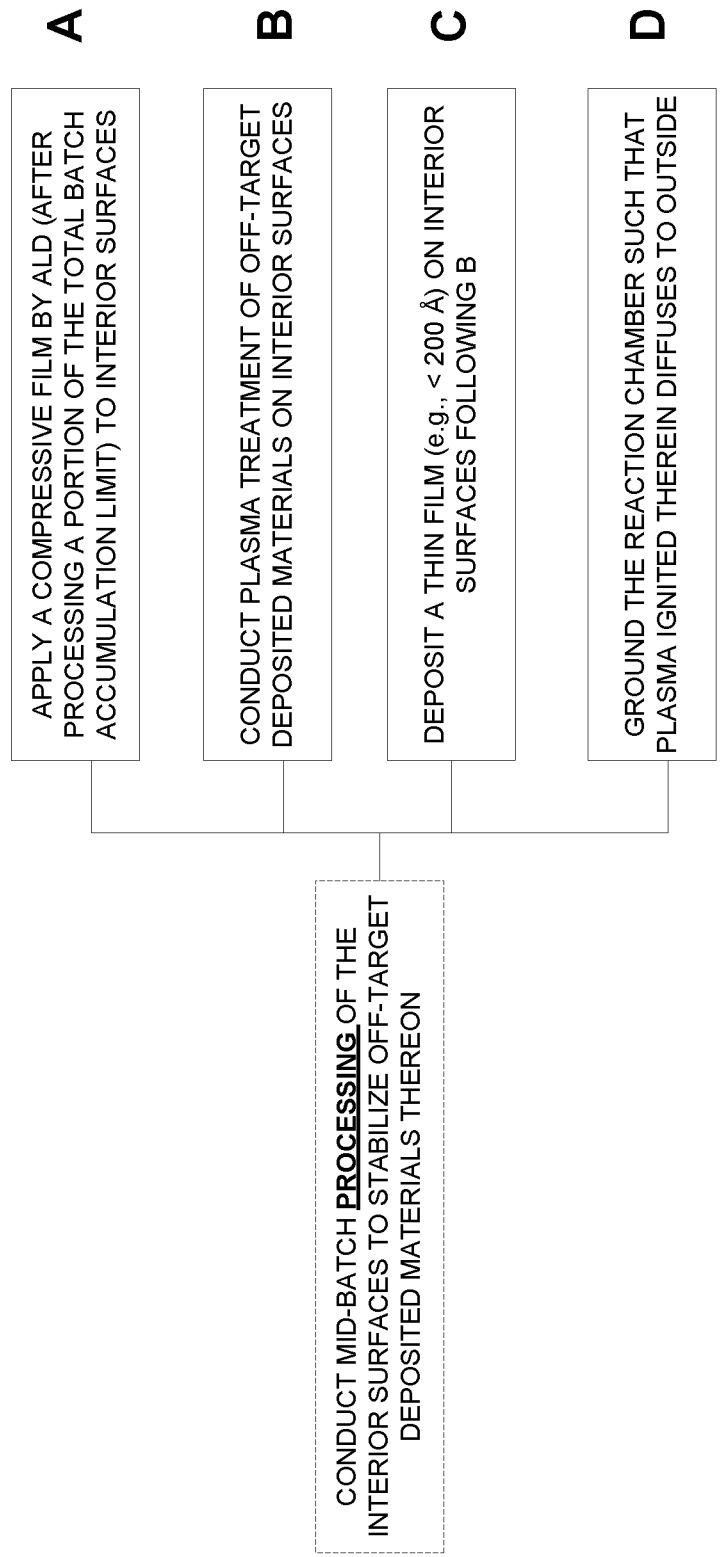

FIG. 4A shows a comprehensive process flow 400 describing BIAS in accordance with one particular embodiment within the general process described with reference to FIG. 4. FIG. 4B will be discussed and described in conjunction with FIG. 4A, and shows several specifics types of mid-batch reaction chamber processing, e.g. conducted at operation 306 in process flow 300, and likewise at operation 412 in process flow 400. After initiation at operation 402, one skilled in the art will appreciate that interior surfaces of the reaction chamber may be prepared, or seasoned, by deposition of a thin film thereon through either traditional deposition methods, or via Atomic Layer Deposition (ALD). The film deposited at seasoning operation 404 may be referred to as a "pre-coat," or as an "undercoat" (UCT), and in some embodiments may comprise a dielectric, such as silicon oxide ($SiO_2$), or other oxide suitable for deposition. Further, silicon oxide may be deposited as an UCT via ALD over a relatively short duration to control the thickness of the deposited film, e.g., ranging from a minimum of 100 Å to a maximum of 2,000 Å, typically within 700 Å to 1,400 Å, over the course of 500 to 1,200 ALD cycles.

ALD is a cyclic process of nominally self-limiting steps that result in digital and small changes in film thicknesses. The process is characterized by smoothness and conformality. The concept of an "ALD cycle" is relevant to the discussion of various embodiments herein. Generally an ALD cycle is the minimum set of operations used to perform a surface deposition reaction one time. The result of one cycle is production of at least a partial silicon-containing film layer on, for example, a substrate surface. Typically, an ALD cycle includes operations to deliver and adsorb at least one reactant to the substrate surface, and then react the adsorbed reactant with one or more reactants to form the partial layer of film. The cycle may include certain ancillary operations such as sweeping one of the reactants or byproducts and/or treating the partial film as deposited. Generally, a cycle contains one instance of a unique sequence of operations. As an example, an ALD cycle may include the following operations: (i) delivery/adsorption of a silicon-containing precursor, (ii) purging of silicon containing precursor from the chamber, (iii) delivery of a second reactant and a plasma, and (iv) purging of plasma from the chamber. Various ranges of flow rates of precursors, process gases and/or reagents suitable for generation and application of various types of UCTs by ALD are shown in FIG. 5A with the column label of "UCT." Flow rates for ALD processes, provided in standard cubic centimeters per minute (sccm), used for applying the UCT, as well as additional various mid-batch processing coatings may include the specific ranges shown in FIG. 5A. For instance, precursors selected from BTBAS (bis-tert-butyalaminosilane), BDEAS (bisdiethylaminosilane) (($Et_2N)_2SiH_2$), or DIPAS (diisopropylaminosilane) may be flowed into the reaction chamber at a volumetric flow rate of 500-3,000 sccm to generate and apply the UCT, e.g., of a silicon oxide ($SiO_2$) such as a silicate glass, to interior surfaces of the reaction chamber. Other suitable exemplary precursors, or reactants, used to generate a silicon-containing UCT may include various other bisalkylaminosilanes, where the alkyl groups thereof may contain 1-6 carbon groups. Also, each amine group may be, separately, mono or di-substituted with alkyl groups. Further, in certain embodiments, alkenyl and alkynyl variations may be employed as precursors or reactants used to generate a silicon-containing UCT. In some cases or configurations, different alkyl groups may be employed on the molecule (e.g., one or more amines may be substituted with methyl groups and one or more other amines may be substituted with ethyl groups). In certain embodiments, one or more alkyl groups may provide steric hindrance of a silane core. Likewise, carrier gases such as argon (Ar) gas may also be flowed into the reaction chamber as needed to generate the UCT.

Next, after seasoning of the reaction chamber at operation 404 to apply an UCT as discussed above, a portion of a batch of wafers is provided to the reaction chamber for processing therein. As introduced earlier for process flow 300, the batch may refer to the maximum quantity of wafers able to be processed by the reaction chamber between required chamber clean cycles. A portion of that batch may be any number less than the entirety of the batch. In some embodiments, the batch may be divided into even portions, for example representing a half, a third, a quarter, etc. of the batch, and these divisions may be empirically correlated with a limit of accumulation just short of that at which there is a substantial likelihood of contamination of a wafer being processed by particle generation from accumulated off-target deposition in the chamber. In one particular example, the batch may be divided into quarters following completion of processing of which the batch is 25%, 50%, 75% and 100% complete. Operation 408 involves processing of a portion of the batch of wafers and may involve, as described earlier, the processing of multiple groups of wafers sequentially, e.g. of one, two to four wafers each, which are cycled in and out of the reaction chamber for processing. In some embodiments, processing at operation 408 may involve one or more techniques performed on the portion of the batch of wafers, including deposition via ALD processes.

Processing of the portion is temporarily interrupted at operation 412, after removal of processed wafers from the reaction chamber, to conduct a mid-batch processing of the reaction chamber. The mid-batch processing stabilizes off-target materials inadvertently deposited on interior surfaces of the reaction chamber during processing of the portion at operation 408.

Among the benefits of BIAS is an increase in the net throughput of the reaction chamber by increasing the maximum batch size able to be processed by the reaction chamber between mandatory clean cycles. A relatively large batch size means that more reaction chamber time is available for the processing of wafers therein rather than interrupting processing frequently to complete comprehensive overhead operations, such as chamber cleaning. Thus, implementation of BIAS will contribute to increased throughput, as well as lower observed defectivity in the batch (e.g., as may be caused by frequent processing interruptions to clean the reaction chamber).

FIG. 4B shows several variants of specific types of processing that may be conducted at operation 412. For instance, off-target deposition materials adhered to sidewalls of the reaction chamber may be secured or sealed in place by variant A, e.g., preventing future flaking or decomposition of the off-target deposition materials which may interfere with the processing of the batch of wafers, by the application (e.g., deposition) of a highly compressible film that binds the off-target deposition materials to the surfaces to which they are adhered, e.g., sidewalls and/or other reaction chamber interior components.

Such a film may be deposited at a set of pre-specified intervals during batch processing, e.g. at 25%, 50% or 75% of the total batch limit, which may be determined empirically. Alternatively, mid-batch processing may be conducted at regular time intervals, e.g., per unit of time elapsed from the initiation of processing. Further, given that off-target materials tend to accumulate on interior surfaces of the reaction chamber proportionate to the number of wafers processed therein since the most recent clean cycle, the interval at which the mid-batch chamber coating may be applied may be selected upon measurement of the accumulation of off-target material. Such measurement may be conducted in addition to, or in place of, applying the mid-batch chamber coating at a specified fraction of the total batch limit.

Typical methods for increasing the compressibility of the film or coating applied to bind off-target deposition materials by mid-batch processing at variant A, a subset of operation 412, include (but are not limited to) applying the film via ALD at: a high radio frequency (RF) power of 2 kw-7 kW, a high pressure 2 T-10 T, a longer RF time (0.2 s-10 s), or through other methods apparent to one skilled in the art. Further, in certain embodiments, one or more of the mentioned techniques may be combined in any combination as needed to increase the compressibility of the film.

A more comprehensive listing of exemplary process conditions is provided in FIG. 5A, under the heading "Mid-batch—½." For instance, suitable mid-batch processing conditions for applying a compressible film coating at, for example, 50% of the total batch accumulation limit may involve the flowing of precursors at a volumetric flow rate 500 to 3,000 sccm. Suitable precursors for the formation and application of a silicon oxide coating may include a silicon-containing species selected from a group including BTBAS (bis-tert-butylaminosilane), BDEAS (bisdiethylaminosilane) (($Et_2N)_2SiH_2$), or DIPAS (diisopropylaminosilane) which may be flowed into the reaction chamber at a volumetric flow rate of 500-3,000 sccm to generate and apply the UCT, e.g., of a silicon oxide ($SiO_2$) such as a silicate glass, to interior surfaces of the reaction chamber. Other suitable exemplary precursors, or reactants, used to generate a silicon-containing UCT may include various other bisalkylaminosilanes, where the alkyl groups thereof may contain 1-6 carbon groups. Also, each amine group may be, separately, mono or di-substituted with alkyl groups. Further, in certain embodiments, alkenyl and alkynyl variations may be employed as precursors or reactants used to generate a silicon-containing UCT. In some cases or configurations, different alkyl groups may be employed on the molecule (e.g., one or more amines may be substituted with methyl groups and one or more other amines may be substituted with ethyl groups). In certain embodiments, one or more alkyl groups may provide steric hindrance of a silane core. Carrier gases such as argon (Ar) gas may also be flowed into the reaction chamber as needed to generate the UCT. Also, in certain embodiments, an oxygen-containing species may be selected from a group including: nitrous oxide ($N_2O$) gas and/or oxygen ($O_2$) gas and flowed into the reaction chamber.

A subsequent purge operation with nitrogen ($N_2$) gas may be used evacuate process reagents from the reaction chamber as needed in the ranges shown, e.g. 5,000-50,000 sccm. In certain embodiments, a second purge operation may be conducted at a similar flow rate range as the first purge. Total reaction chamber pressure may be maintained during deposition (e.g., ALD) and purge operations between 1 T-10 T.

Likewise, step timings for deposition and related purge operations are shown beneath the approximate flow rate ranges. Dosage timing indicates precursor dosing time in seconds; PDP indicates post dose purge time, e.g., of inert gas flow to remove the deposition precursor from a wafer reaction zone within the reaction chamber; RF time refers to the period of time that the radio frequency (RF) plasma power is on with reactant present during a deposition operation; and RF purge time refers to the duration of the purge without reactant or plasma power following the RF plasma-powered deposition. Additional reaction chamber process parameters available for adjustment during ALD and purge operations include chamber temperature and power settings. For instance, an ampoule temperature refers to the reactant temperature as it enters the chamber and may be in the range of 20° C.-80° C.; a gas line temperature refers to the temperature at which process gases are delivered to the reaction chamber through a gas line and may be in the range of 20° C.-85° C.; a pedestal ("ped") temperature refers to the temperature of the pedestal holding the wafer(s) intended for processing and may be in the range of 20° C.-550° C. depending on process application and deposited film requirements; a chamber temperature refers to the internal temperature of the reaction chamber during ALD and related purge processes and may be set at a range of 20° C.-85° C.; and a top plate temperature may be set with a range of 20° C.-85° C.

Acceptable power settings include that shown in FIG. 5A, in the specific ranges for various reaction chamber components, such as for the showerhead ("SHD"), and pedestal ("ped"), both of which may be provided at a frequency range as shown. Moreover, in certain embodiments, post-treatment processes may be applied in combination with the ALD and related purge processes shown for the Mid-Batch—½ processing in FIG. 5A in the approximate power levels, gas species flowed into the reaction chamber, frequency and time intervals shown.

In some embodiments, instead of applying a compressible film to coat and seal off-target deposition materials as described above, the accumulated off-target deposition materials on interior surfaces of the reaction chamber may be exposed to a plasma, e.g., as shown by variant B. Plasma exposure may be conducted at a low pressure to, for example, allow the plasma to more easily diffuse into the off-target deposition materials to stabilize such materials in place preventing them from falling on the batch of wafers during processing, at a desired interval of the total batch accumulation limit, e.g. 25%, 50% or 75%. For instance, suitable reaction chamber process conditions for variant B may be as shown by "Mid-batch—3" in FIG. 5B, along with optional post-treatment. Plasma may be generated in the same manner as that shown for deposition as shown in the "Process" column of FIG. 5A and may be delivered to the process chamber between the showerhead, which may be powered, and the pedestal, which may be grounded. Further, in certain embodiments, the plasma, generated as described above, may diffuse to improve the quality of materials deposited on a carrier ring that may be positioned within the reaction chamber to hold the wafers during processing. The carrier ring may be made from a high-impedance ceramic oriented or configured to focus plasma power onto the grounded pedestal.

In some embodiments, the plasma treatment set forth in variant B may be followed by deposition of a thin film, e.g., less than 200 Å, on the plasma-treated off-target deposition materials on the interior surfaces of the reaction chamber, as shown in variant C. Also, variant C may involve the initial application of a non-dose, e.g., without flow of reactive precursors or deposition reagents, oxidizing plasma treatment provided at low pressures. Further, the plasma provided to first stabilize the off-target deposition materials may be generated from argon gas (Ar) or argon gas and oxygen gas ($O_2$) mixtures, which may be ignited from a position behind the showerhead 111 as shown in FIGS. 1 and 2. Thus, variant C may be accomplished by selecting and applying certain process parameters as shown earlier in the Mid-batch—½ column in FIG. 5A to deposit the thin film via ALD subsequent to plasma treatment of the off-target deposition materials. Such an ALD process may involve short reactant flow times to deposit a thinner film e.g., less than 200 Å.

In a traditional processing sequence for variant C, chemicals, such as reactive species used to conduct deposition on the substrate 107 may flow out from the showerhead 111. Inert gases used to generate the plasma used for variant C are typically difficult to ignite. Thus, electric power may be supplied to ignite the inert gases on a faceplate of the showerhead 111. Further, in such circumstances, a secondary purge (e.g. to purge gases and/or other species from the reaction chamber) is turned off to permit for the plasma to dissipate outwardly uniformly throughout the processing chamber.

Next, after exposure of the off-target deposition materials to the plasma as described above, a thin film, e.g. less than 200 Å, may be deposited thereon to hold or solidify off-target deposition materials in place. Such a coating may comprise silicon oxide or another suitable oxide. Further, in some embodiments, additional processing of the thin film post deposition, such as annealing or plasma processing, may be conducted.

Variant D shown in FIG. 5B may be conducted in conjunction with either variants A, B and C and involves grounding the reaction chamber such that plasma ignited therein ultimately diffuses to outside regions of the reaction chamber (e.g., toward sidewalls). Traditionally, a pedestal or support holding a substrate, such as the substrate 107 shown in FIGS. 1 and 2, is grounded while the showerhead delivering species toward the substrate for deposition thereon is electrically powered. Here, according to variant D and in contrast to traditional configurations, the pedestal may be powered while the showerhead is grounded. For instance, parameters shown in the column for "Mid-batch—4," shown in FIG. 5B, may be selectively applied to result in the grounding of the reaction chamber, e.g. the pedestal may be operated with a power level ranging from 500 W-7 kW. Such a configuration provided by variant D may assist in targeting an area within the reaction chamber for plasma activation, directionality of application, and bombardment; e.g., toward sidewalls of the reaction chamber having off-target materials deposited thereon. Such plasma may then diffuse towards the outside region of the reaction chamber after usage to process or treat off-target deposited materials on the chamber sidewalls and other chamber components.

After successful completion of one or more variants A-D and/or combinations on the variants A-D, which collectively constitute mid-batch reaction chamber processing at operation 412, another portion of the batch of wafers is inserted into the reaction chamber at operation 414 for processing therein at operation 416. Decision operation 420 determines whether the reaction chamber batch size limit has been reached during operations 408 and 416, for processing of the initial and any additional portions of the batch of wafers. For instance, if the outcome of the determination is "NO," then the process workflow 400 cycles back to operation 412 for additional mid-batch processing and deposition to allow for the additional portion of the batch of wafers to be processed. Thus, one skilled in the art will appreciate that employing BIAS and mid-batch processing at operation 412 in the process workflow 400 results in expansion of the batch size permitting for additional wafers to be processed between mandatory reaction chamber clean cycles.

Eventually, and potentially after multiple executions of mid-batch reaction chamber processing operations 412, a total batch accumulation limit will be reached at operation 420 where interior surfaces of the reaction chamber will have (or possibly exceed) a threshold quantity of off-target materials deposited on interior surfaces of the reaction chamber, resulting in an outcome of "YES" at operation 420. Accordingly, the process workflow 400 will progress toward end operation 422 where a chamber clean is conducted.

FIGS. 5A and 5B, as referred to earlier, show tables providing various exemplary process parameter data values corresponding with various wafer processing and mid-batch reaction chamber processing operations. Such values as shown are intended to be representative of parameters used in the various BIAS-related processes described above, but are not exhaustive and are not intended to be limiting. Process values and/or parameters may be adjusted as needed to achieve specific wafer processing throughput goals.

Various individual parameters are listed vertically in the "Parameters" column of both FIGS. 5A and 5B. And, as introduced earlier, flow is provided in sccm for the volumetric flow rate of precursors, reactants and/or inert purge species in and out of the reaction chamber. Step timings shown in FIGS. 5A and 5B are as described earlier, e.g., dose time, etc. Likewise, the remaining parameters included for temperature, power level, and optional post-treatment settings are as described earlier, e.g., corresponding to one or more of the application of the UCT, or mid-batch processing via any one or more of the variants A-D.

FIG. 5A also shows approximate parameter setting ranges suitable for processing of the batch of wafers, listed under the "Process" column. Processing of the batch may take place by depositing a film of a desired thickness thereon using ALD techniques as described earlier and may involve the flowing of precursor and reagent species in the quantities and/or combinations shown.

The remaining columns of UCT, Mid-batch—½, Mid-batch—3, and Mid-batch—4 represent the application of the undercoat during the pre-processing seasoning of the reaction chamber, and variants A-D, respectively. That is, the column header of "UCT" denotes operational conditions, or settings, for generation and application of a pre-processing seasoning undercoat on interior reaction chamber surfaces. Likewise, in certain embodiments, the column header of "Mid-batch—½" denotes settings for variant A; the column header of "Mid-batch—3" denotes settings for variant B; and, column header of "Mid-batch—4" denotes settings for variant D. Variant C may be conducted by selectively combining setting ranges provided in column headers Mid-batch—½ and Mid-batch—3.

FIG. 6 shows another table of exemplary process parameters for a remote clean recipe that may be used to conduct a remote clean of the reaction chamber at, for example, the end of the process workflow 400 at operation 422. Acronyms HP and LP denote "high-pressure" and "low-pressure," respectively (and as also reflected in their respective pressure ranges shown in FIG. 6). Various recipes of species used to generate plasmas employed for cleaning may be used. After the successful removal of off-target deposition materials from interior surfaces of the reaction chamber by completed clean cycle, BIAS processes as shown by process workflows 300, or 400, may be re-initiated to process additional batches of wafers as desired.

Apparatus

Figure 7:
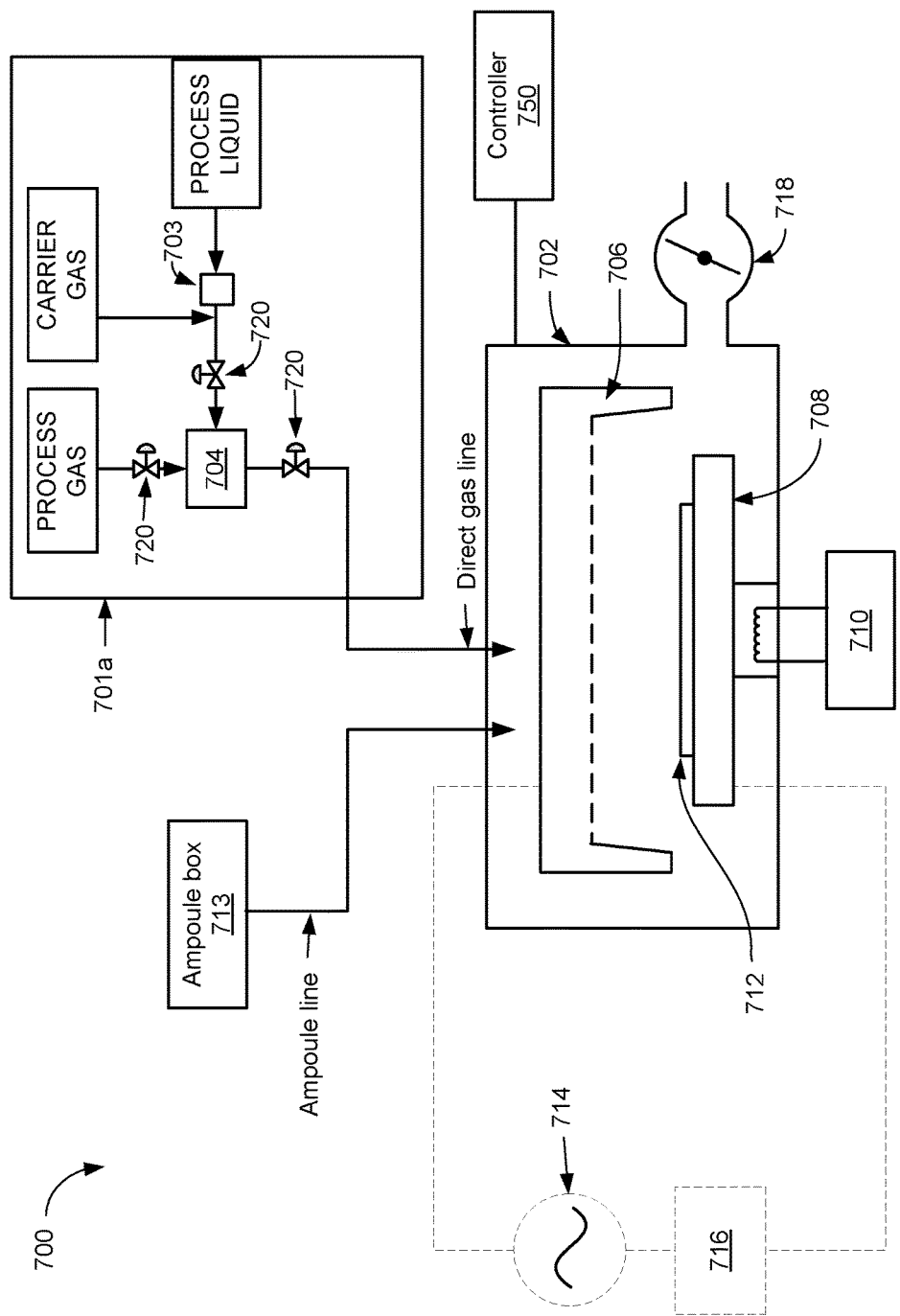
FIG. 7 is a schematic diagram of an example process tool for performing certain disclosed embodiments.

FIG. 7 depicts a schematic illustration of an embodiment of an atomic layer deposition (ALD) process station 700 having a process chamber 702. The process station 700 may be used for performing certain disclosed embodiments. For example, while process station 700 may typically be used to deposit films by atomic layer deposition (ALD) on a substrate, process station 700 may be used in certain configurations to, for example, conduct atomic layer etching (ALE) or atomic layer cleaning (ALC) to etch or to clean, respectively, carbon-containing material in a patterning scheme. In some embodiments, process station 700 may be used for ALE, ALC and ALD, or in some embodiments, several process stations in a multi-station tool may include a station for ALE or ALC and a station for ALD such that substrates may be transferred between an ALC station and ALD station without breaking vacuum.

Figure 8:
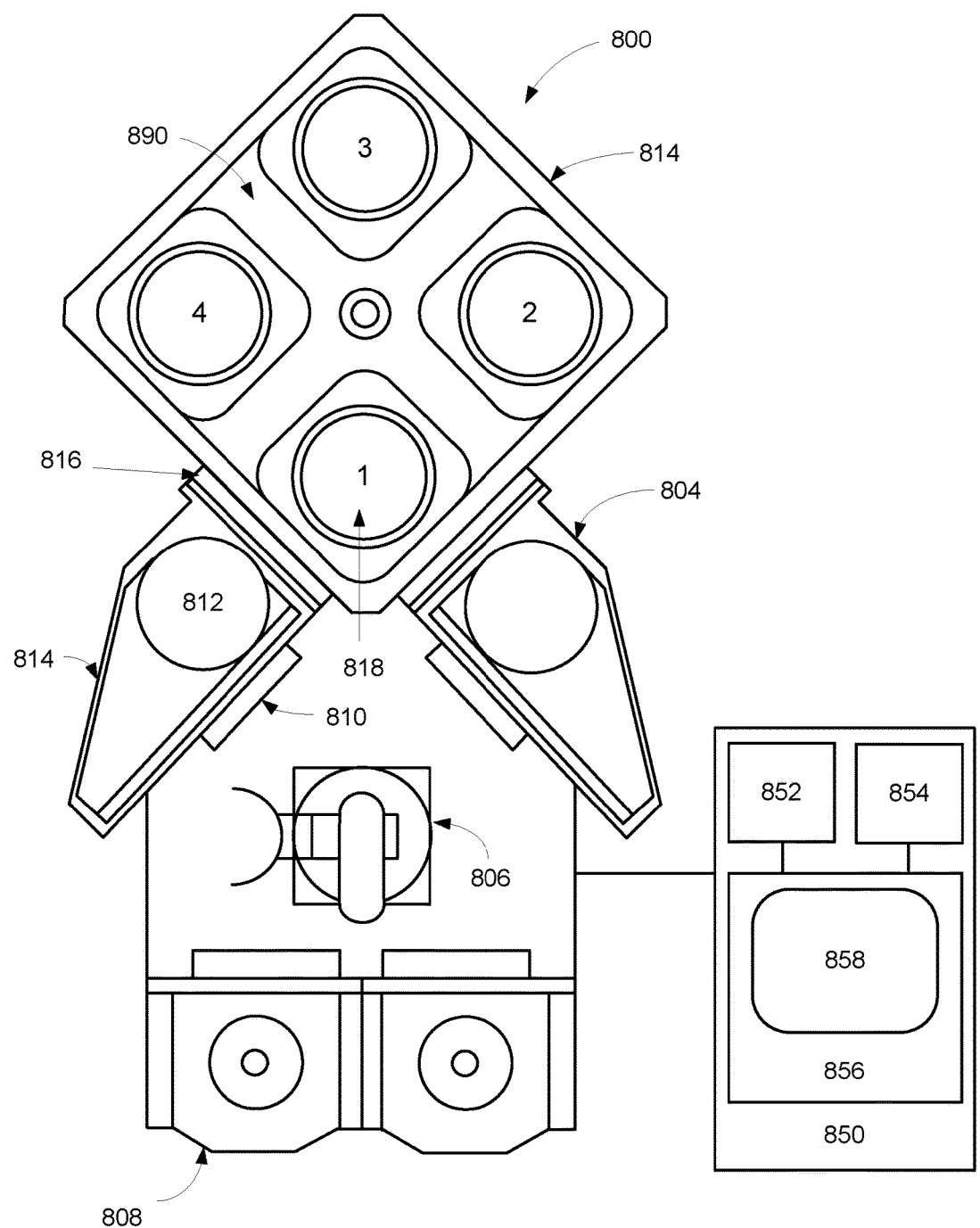
FIG. 8 is a schematic diagram of another example process tool for performing certain disclosed embodiments.

Process chamber 702 may be used for maintaining a low-pressure environment. A plurality of process stations may be included in a common low pressure process tool environment. For example, FIG. 8 depicts an embodiment of a multi-station processing tool 800. In some embodiments, one or more hardware parameters of process station 700, including those discussed in detail below may be adjusted programmatically by one or more computer controllers 750.

Process station 700 fluidly communicates with reactant delivery system 701a for delivering process gases to a distribution showerhead 706. Reactant delivery system 701a includes a mixing vessel 704 for blending and/or conditioning process gases, such as an oxygen-containing gas, or inert gas, for delivery to showerhead 706. One or more mixing vessel inlet valves 720 may control introduction of process gases to mixing vessel 704.

As an example, the embodiment of FIG. 7 includes a vaporization point 703 for vaporizing liquid reactant to be supplied to the mixing vessel 704. In some embodiments, deposition chemistry may be provided as a vaporized liquid reactant. Deposition chemistry may be used following performing ALE or ALC in process chamber 702 to form a patterned carbon-containing material such that a conformal film may be deposited by ALD over the patterned carbon-containing material. In some embodiments, vaporization point 703 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 704.

In some embodiments, a liquid precursor or liquid reactant may be vaporized at a liquid injector (not shown in FIG. 7). For example, a liquid injector may inject pulses of a liquid reactant into a carrier gas stream upstream of the mixing vessel 704. In one embodiment, a liquid injector may vaporize the reactant by flashing the liquid from a higher pressure to a lower pressure. In another example, a liquid injector may atomize the liquid into dispersed micro-droplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller (LFC) upstream of vaporization point 703 may be provided for controlling a mass flow of liquid for vaporization and delivery to process chamber 702. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 706 distributes process gases toward substrate 712. In the embodiment shown in FIG. 7, the substrate 712 is located beneath showerhead 706 and is shown resting on a chuck or pedestal 708. The showerhead 706 may be positioned at a distance of between 350 mils (0.35 in.) to 700 mils (0.7 in.) to attain a desirable level of directionality of ions provided, or dispersed, by showerhead 706 toward substrate 712. In some embodiments, a lower, or lesser, gap between showerhead 706 and pedestal 708 may be employed to retain directionality of ions dispersed from showerhead 706. However, at low pressure conditions (e.g. below 10 mT, or 0.01 Torr) a higher, or larger, gap may be needed to achieve stable dispersion of ionized plasma from showerhead 706. In some embodiments, a chamber may include multiple chucks or pedestals. Showerhead 706 may have any suitable shape, and may have any suitable number and arrangement of ports for distributing process gases to substrate 712.

In some embodiments, pedestal 708 may be raised or lowered to expose substrate 712 to a volume between the substrate 712 and the showerhead 706. In some embodiments, pedestal 708 may be temperature controlled via heater 710. Pedestal 708 may be set to any suitable temperature, such as between about 25° C. and about 650° C. or between about 35° C. and about 100° C. during operations for performing various disclosed embodiments. It will be appreciated that, in some embodiments, pedestal height may be adjusted programmatically by a suitable computer controller 750.

In another scenario, adjusting a height of pedestal 708 may allow a plasma density to be varied during plasma activation performed in certain disclosed embodiments. For example, plasma may be ignited when an inert gas is flowed to the substrate 712 via showerhead 706 to remove modified core material after the core material is exposed to an oxygen-containing gas. At the conclusion of a process phase, pedestal 708 may be lowered during another substrate transfer phase to allow removal of substrate 712 from pedestal 708.

In some embodiments, a position of showerhead 706 may be adjusted relative to pedestal 708 to vary a volume between the substrate 712 and the showerhead 706. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers 750. The computer controller 750 may include any of the features described below with respect to controller 750 of FIG. 7.

In some embodiments where plasma may be used as discussed above, showerhead 706 and pedestal 708 electrically communicate with a radio frequency (RF) power supply 714 and matching network 716 for powering a plasma. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Likewise, RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. In some embodiments, an OES sensor may be used to set an endpoint to stop etching after a certain amount of time using certain disclosed embodiments. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., oxygen-containing gas), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second gas such as argon, instructions for modulating the flow rate of a carrier or purge gas, instructions for igniting a plasma at low plasma power between about 250 W and about 750 W for a four-station processing tool, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the third recipe phase. Such recipes may be used to etch carbon-containing material such as core material on a substrate to yield vertical sidewalls that meet the surface of an underlying layer to be etched at a point at about $90°\pm5°$. Additional recipes may also follow and may be used to deposit a conformal film over the patterned core material by ALD. For example, for depositing a silicon oxide conformal film over a patterned core material, one additional recipe phases may include instructions for setting a flow rate of a silicon-containing precursor, and another additional recipe phase may include instructions for setting a flow rate of an oxygen-containing reactant and time delay instructions for the additional recipe phase. It will be appreciated that these recipe phases may be further subdivided and/or iterated in any suitable way within the scope of the present disclosure.

Further, in some embodiments, pressure control for process station 700 may be provided by butterfly valve 718. As shown in the embodiment of FIG. 7, butterfly valve 718 throttles a vacuum provided by a downstream vacuum pump (not shown in FIG. 7). However, in some embodiments, pressure control of process station 700 may also be adjusted by varying a flow rate of one or more gases introduced to the process station 700.

As described above, one or more process stations may be included in a multi-station processing tool. FIG. 8 shows a schematic view of an embodiment of a multi-station processing tool 800 with an inbound load lock 802 and an outbound load lock 804, either or both of which may include a remote plasma source (not shown in FIG. 8). A robot 806, at atmospheric pressure, is configured to move wafers from a cassette loaded through a pod 808 into inbound load lock 802 via an atmospheric port 810. A wafer (not shown in FIG. 8) is placed by the robot 806 on a pedestal 812 in the inbound load lock 802, the atmospheric port 810 is closed, and the inbound load lock 802 is pumped down. Where the inbound load lock 802 includes a remote plasma source, the wafer may be exposed to a remote plasma treatment in the inbound load lock 802 prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 includes four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. For example, in some embodiments, a process station may be switchable between an ALC, an ALD and plasma-enhanced ALD process mode. In some embodiments, exposure to a deposition precursor and exposure to a second reactant and plasma are performed in the same station. Additionally or alternatively, in some embodiments, processing chamber 814 may include one or more matched pairs of ALD and plasma-enhanced ALD process stations. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog, and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition (e.g., silicon-containing gases, oxygen-containing gases, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 850 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 refers to electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer clean (ALC) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of increasing a reaction chamber batch size, the method comprising:
    (a) processing a portion of a batch of wafers within the reaction chamber, wherein the processing results in at least some off-target deposition of material on interior surfaces of the reaction chamber;
    (b) without cleaning the chamber, conducting a mid-batch reaction chamber processing to stabilize the off-target deposition material accumulated on interior surfaces of the reaction chamber comprising depositing a dielectric film coating that binds to the material on the interior surfaces of the reaction chamber; and
    (c) processing another portion of the batch of wafers within the reaction chamber.

2. The method of claim 1, further comprising:
repeating (b)-(c) until the processing of the batch of wafers is complete.

3. The method of claim 1, further comprising:
seasoning the interior surfaces of the reaction chamber prior to batch processing therein.

4. The method of claim 3, wherein the seasoning the interior surfaces of the reaction chamber involves applying a coating of the same material that is used for deposition on the batch of wafers during (a) or (c).

5. The method of claim 1, wherein (a) or (c) involves depositing a material on a wafer of the batch of wafers.

6. The method of claim 3, wherein the seasoning comprises applying a coating to interior surfaces of the reaction chamber by atomic layer deposition (ALD) while no wafers are present in the reaction chamber.

7. The method of claim 1, further comprising:
    (d) cleaning the reaction chamber interior surfaces following completion of (c).

8. The method of claim 2, further comprising:
    (d) cleaning the reaction chamber interior surfaces after processing of the batch of wafers is complete.

9. The method of claim 1, wherein (b) is conducted at specified intervals of a total batch accumulation limit of the batch of wafers.

10. The method of claim 9, wherein the total batch accumulation limit is the thickness of accumulated material on interior surfaces of the reaction chamber beyond which processing is compromised such that cleaning of the reaction chamber is required prior to further processing.

11. The method of claim 9, wherein the specified intervals occur prior to a detrimental level of material accumulation on interior surfaces of the reaction chamber that results in flaking of the material and production of wafer defects and/or particles.

12. The method of claim 1, wherein the compressive stress of the deposited film coating is enhanced by adjusting any one or more selected from a group consisting of: radio frequency (RF) power levels, reaction chamber pressure, or RF processing time.

13. The method of claim 12, further comprising:
    (d) grounding the reaction chamber.

14. The method of claim 8, wherein plasma used to conduct (d) is supplied by a remote plasma clean unit.

15. A plasma processing apparatus for processing a substrate, the apparatus comprising:
    a reaction chamber comprising:
        interior chamber surfaces,
        a substrate support for supporting a substrate within the reaction chamber, and
        an exhaust port for removing material from the reaction chamber;
    a remote plasma chamber comprising:
        a plasma generator for generating plasma within the remote plasma chamber,
        an inlet for delivering gas to the remote plasma chamber,
        an outlet for providing plasma generated in the remote plasma chamber to the reaction chamber; and
    a controller configured to execute instructions for:
        (a) processing a portion of a batch of wafers within the reaction chamber, wherein the processing results in at least some off-target deposition of material on interior surfaces of the reaction chamber;
        (b) without cleaning the chamber, conducting a mid-batch reaction chamber processing to stabilize the off-target deposition material accumulated on interior surfaces of the reaction chamber comprising depositing a dielectric film coating that binds to the material on the interior surfaces of the reaction chamber; and
        (c) processing another portion of the batch of wafers within the reaction chamber.

16. The apparatus of claim 15, wherein the plasma processing apparatus is remote from the reaction chamber.

17. The apparatus of claim 15, wherein the controller is further configured to execute instructions for:
    (d) cleaning the interior surfaces of the reaction chamber following completion of (c).

18. The method of claim 1, wherein the dielectric material that is deposited in (b) is $SiO_2$.

19. The method of claim 1, wherein each wafer of the batch of wafers has a diameter between 200 mm and 450 mm.

20. The method of claim 19, wherein each wafer of the batch of wafers has a diameter of 300 mm.

* * * * *